United States Patent [19]

Hitotsuyanagi et al.

[11] Patent Number: 4,496,450

[45] Date of Patent: Jan. 29, 1985

[54] PROCESS FOR THE PRODUCTION OF A MULTICOMPONENT THIN FILM

[75] Inventors: Hajime Hitotsuyanagi; Nobuhiko Fujita; Hideo Itozaki; Hiromu Kawai, all of Itami, Japan

[73] Assignee: Director General of Agency of Industrial Science and Technology Michio Kawata, Tokyo, Japan

[21] Appl. No.: 594,828

[22] Filed: Mar. 29, 1984

[30] Foreign Application Priority Data

Mar. 1, 1983 [JP] Japan ................................. 58-53850

[51] Int. Cl.$^3$ ............................................. C23C 15/00
[52] U.S. Cl. ............................ 204/192 R; 204/192 C; 427/38; 427/39; 427/42
[58] Field of Search ....................... 204/192 R, 192 C; 427/42, 39, 38

[56] References Cited

U.S. PATENT DOCUMENTS

| | | | |
|---|---|---|---|
| 3,485,666 | 12/1969 | Sterling et al. | 427/39 |
| 3,991,229 | 11/1976 | Fengler | 427/42 |
| 4,056,642 | 11/1977 | Saxena et al. | 427/39 |
| 4,058,638 | 11/1977 | Morton | 427/39 |
| 4,234,622 | 11/1980 | Dubuske et al. | 427/38 |
| 4,452,828 | 6/1984 | Namba et al. | 427/38 |

Primary Examiner—Arthur P. Demers
Attorney, Agent, or Firm—Wenderoth, Lind & Ponack

[57]  ABSTRACT

A multicomponent amorphous silicon film suitable for a solar cell is produced at a higher deposition rate by a novel process comprising using jointly a sputtering method and a plasma CVD method within a pressure range of not lower than a pressure at which the maximum film formation rate is given in the sputtering method.

15 Claims, 4 Drawing Figures

PROCESS FOR THE PRODUCTION OF A MULTICOMPONENT THIN FILM

BACKGROUND OF THE INVENTION

1. Field of the Invention

This invention relates to a process for the production of a thin film and more particularly, it is concerned with a novel process for the production of a multicomponent amorphous silicon thin film.

2. Description of the Prior Art

For the production of a thin film, there have hitherto been proposed PVD (Physical Vapor Deposition) methods such as vacuum vapor deposition method, ion plating method and sputtering method, CVD (Chemical Vapor Deposition) methods such as ordinary pressure CVD method, reduced pressure CVD method, plasma CVD method and spraying method, and plating methods. Above all, the sputtering method and plasma CVD method have lately been used widely in the field of manufacturing thin films, since they make possible production of thin films which has hitherto been impossible, and they make possible production of thin films at low temperature by utilizing energy of glow discharge plasma.

The properties required for thin films differ depending on the quality and use thereof and a process for the production thereof is correspondingly limited. Problems of the production process will be discussed as to amorphous silicon exemplified, which has lately been watched as a low cost thin film semiconductor material for a solar cell capable of utilizing clean and inexhaustible energy. The plasma CVD method, sputtering method, ion plating method, ion beam sputtering method and CVD method have been studied as a method of making an amorphous silicon film, and at the present time, the plasma CVD method has been considered best from the standpoint of the film quality, i.e. device properties as, for example, solar cell.

When an amorphous silicon film is produced by the plasma CVD method, however, the film growing rate is very low, i.e. at most about 1 Å/sec and thus the production cost is not so decreased. Furthermore, solar cells of amorphous silicon have a lower conversion efficiency than those of other crystal semiconductors such as Si and GaAs. Therefore, amorphous silicon has not been used yet as a power source.

In order to increase the photovoltaic conversion efficiency, effective use of solar energy is required over wide wavelength range and to this end, it has been studied to add other elements (modifiers) to amorphous silicon to vary the optical band gap thereof. However, this method has a drawback that in the case of adding a modifier to amorphous silicon, the modifier should be used in gaseous state according to the plasma CVD method, so that a raw material gas is limited.

Moreover, it has been proposed to use an amorphous silicon film fabricated by a process of a glow discharge in silane as a body of semiconductor devices (U.S. Pat. No. 4,064,521). The thus resulting amorphous silicon has a greater electron life time than amorphous silicon formed by the sputtering or evaporation method, but this process is not suited for incorporating modifiers into amorphous silicon.

SUMMARY OF THE INVENTION

It is an object of the present invention to provide a process for the production of a thin film.

It is another object of the present invention to provide a process for the production of multicomponent amorphous silicon at a higher deposition rate.

It is a further object of the present invention to provide a process whereby a modifier capable of changing the film quality can readily be added to amorphous silicon.

These objects can be attained by a process for the production of a multicomponent thin film, characterized by using a sputtering method and a plasma CVD method at a pressure range of not lower than a pressure capable of giving the maximum rate of film formation by the sputtering method.

DETAILED DESCRIPTION OF THE INVENTION

The present invention provides a process for the production of a thin film, characterized by superimposing a sputtering method and plasma CVD method and more particularly, a process for the production of a multicomponent thin film, characterized by using jointly a sputtering method and plasma CVD method simultaneously in a pressure range of not lower than a pressure capable of giving the maximum rate of film formation by the sputtering method.

When using monosilane ($SiH_4$) as a raw material gas and argon (Ar) as a rare gas in the plasma CVD method and sputtering using crystalline silicon as a target in the above described process, for example, the film growing rate can markedly be increased, and when using silicon doped with impurities such as boron and phosphorus as a target, p-type or n-type amosphous silicon can be obtaied. The sputtering can be carried out using an element to be a dopant or modifier as a target.

Figure 1:
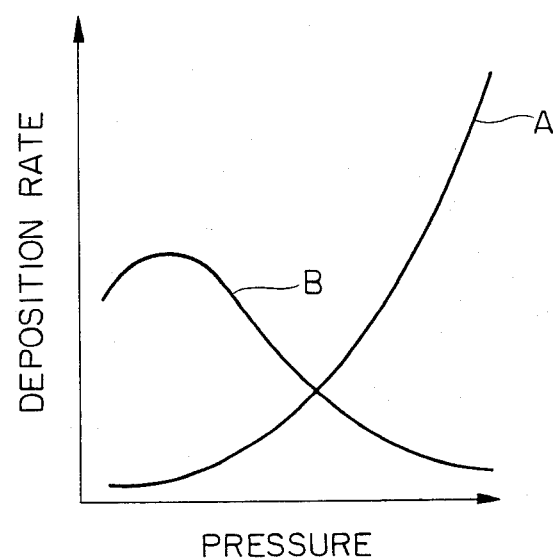
FIG. 1 is a graph showing the relationship between the deposition rates and pressures in the reaction system according to the present invention.

In the above described process, the sputtering is not in conformity with the plasma CVD in the relationship of the pressure and deposition rate in the reaction system and accordingly, desirable results cannot be obtained by mere superimposition of both the methods. FIG. 1 shows this relationship, in which curve A is the case of the plasma CVD method and curve B, the sputtering method. It is apparent from this relationship that the sputtering method and plasma CVD method should be carried out simultaneously in a pressure range of not lower than a pressure at which the film forming rate (deposition rate) of the sputtering method becomes maximum.

The present invention will now be illustrated in detail concerning one embodiment.

Figure 2:
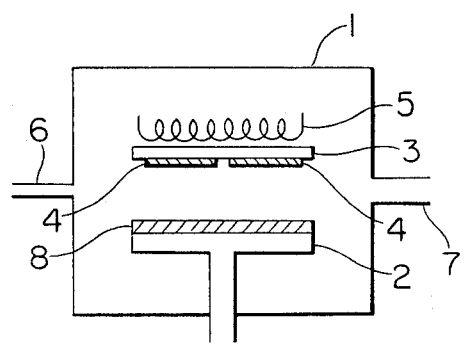
FIG. 2 is a cross-sectional view of one example of an apparatus used for the practice of the present invention.

FIG. 2 is a cross-sectional view of an apparatus for the production of a thin film, used for the practice of the present invention, comprising vacuum reaction chamber 1, cathode 2 connected electrically with a radio frequency (RF) power source (not shown), anode 3 serving as a substrate holder also, substrate 4 heated by heater 5, gas feed pipe 6, vacuum exhaust pipe 7 connected with a vacuum pump (not shown) and target 8 provided on cathode 2 to be sputtered.

The operation of the apparatus for producing a thin film shown in FIG. 2 is carried out as follows:

Vacuum reaction chamber 1 is evacuated through vacuum exhaust pipe 7 by a vacuum pump. During the same time, it is preferable to hold a vacuum degree of $10^{-3}$ Torr or higher, more preferably up to $10^{-7}$ Torr in order to reduce the effect of residual gases such as oxygen, water, hydrocarbons, nitrogen, etc. Then, substrate 4 on substrate holder 3 is heated at a desired temperature (room-400° C.) by heater 5. A rare gas such as argon and raw material gas for plasma CVD are fed to vacuum reaction chamber 1 from gas feed pipe 6 and vacuum reaction chamber 1 is held at a desired pressure by controlling the quantity of the gas exhausted through vacuum exhaust pipe 7. The pressure of vacuum reaction chamber 1 is preferably in the range of from $5 \times 10^{-3}$ to 1 Torr, since if the pressure is higher than 1 Torr, sputtering is hard to occur, while if lower than $5 \times 10^{-3}$ Torr, film formation by plasma CVD is decreased. Then, a RF voltage is applied to cathode 2 to cause glow discharge in vacuum reaction chamber 1, during which a gaseous raw material fed from gas feed pipe 6 is subjected to glow discharge decomposition and precipitated as a film on substrate 4 and at the same time, target 8 is sputtered by a rare gas ion such as argon ion and the target material is also precipitated on substrate 4. Various films can be formed by choice of various raw material gases and target materials in combination.

The above described embodiment is based on skilfull combination of the conversion of a solid raw material into a thin film characteristic of sputtering and the conversion of a gaseous raw material into a thin film characteristic of plasma CVD. When the above described sputtering and plasma CVD are superimposed by an ordinary sputtering apparatus of planar type, however, the deposition rate as a whole film is low due to the low deposition rate of sputtering, and it is required to hold the gas pressure lower. In addition, when a radio frequency power is raised so as to increase the sputtering rate, the plasma near the base plate is also strengthened to deteriorate the film. Since a plasma used for CVD and plasma used for sputtering have a same strength, a gaseous raw material forms a film on the target surface to prevent the target material from sputtering, and a modifier is hardly introduced into amorphous silicon.

Another embodiment of the present invention is developed to overcome these disadvantages and consists in using magnetron sputtering in a process for the production of a thin film wherein a plasma CVD method and sputtering method are superimposed. That is to say, in the production of a multicomponent thin film by superimposing a sputtering method and plasma CVD method, the sputtering is carried out by magnetron sputtering and the superimposition is carried out within a pressure range of not lower than a pressure at which the film forming rate of the sputtering is maximum.

Figure 3:
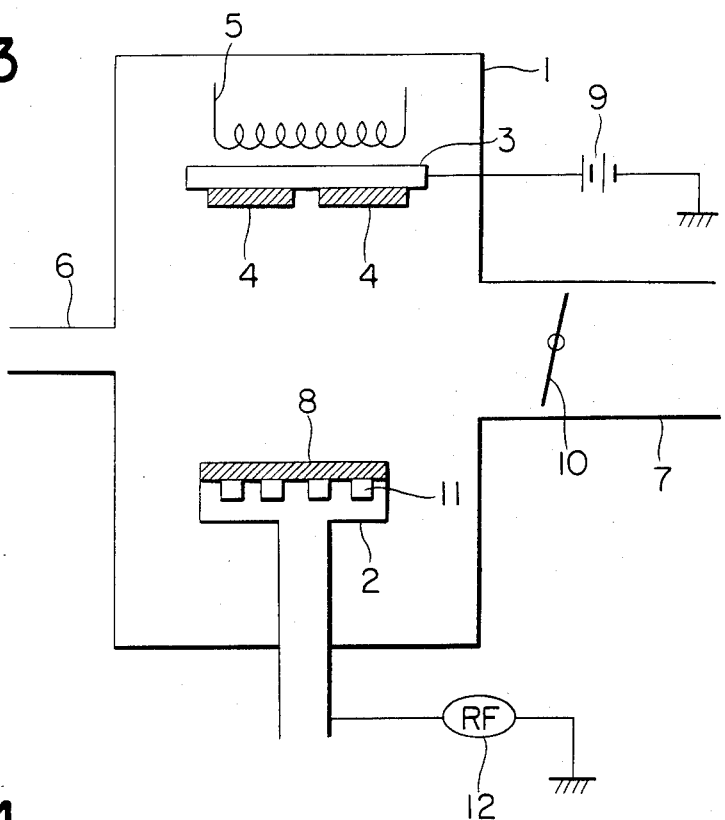
FIG. 3 is a cross-sectional view of another example of an apparatus used for the practice of the present invention.

FIG. 3 is a cross-sectional view of an apparatus for the production of thin films, used for the practice of the present invention, comprising vacuum reaction chamber 1, cathode 2 connected electrically with radio frequency (RF) power source 12, substrate 4 fitted to substrate holder 3 and heated by heater 5, a bias voltage (0–1000 V) being applied to substrate holder 3 by DC power source 9, gaseous raw material feed inlet 6, vacuum exhaust pipe 7 connected with a vacuum pump (not shown), exhaust control valve 10 for controlling the degree of vacuum, target 8 provided on cathode 2 and magnet 11 for magnetron sputtering by forming a magnetic field on target 8, fitted to cathode 2.

Figure 4:
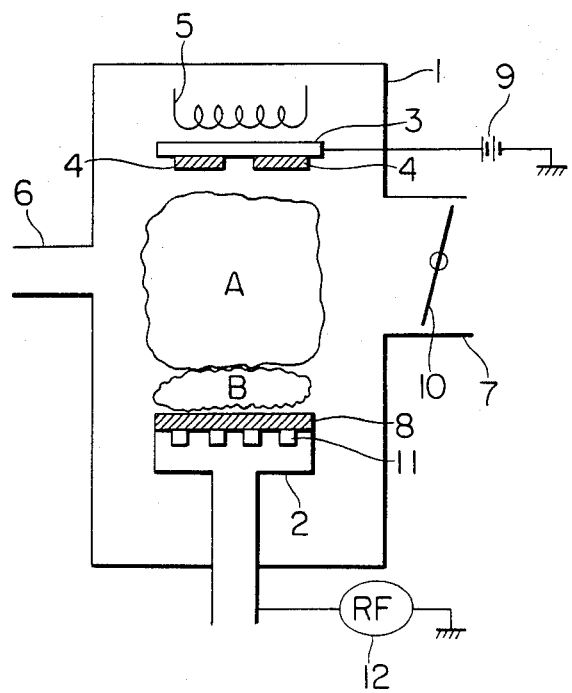
FIG. 4 is a schematic view showing a plasma state generated in a reaction chamber when the process of the present invention is carried out.

The operation of the apparatus for producing a thin film, shown in FIG. 3 is carried out as follows:

Vacuum reaction chamber 1 is evacuated through vacuum exhaust pipe 7 by a vacuum pump. During the same time, it is preferable to hold a vacuum degree of $10^{-7}$ Torr or higher vacuum degree in order to reduce the effect of residual gases, in particular, oxygen, water, hydrocarbons, nitrogen, etc. Then, substrate 4 on substrate holder 3 is heated at a desired temperature by heater 5. A sputtering gas such as argon and raw material gas for plasma CVD are fed to vacuum reaction chamber 1 from gas feed pipe 6 and vacuum reaction chamber 1 is held at a desired pressure by controlling the exhaust capacity of the vacuum pump through control valve 10 to control the quantity of the gas exhausted through vacuum exhaust pipe 7. When the raw material gas for plasma CVD can also be used as the sputtering gas, it is possible to feed only one gas. The pressure of vacuum reaction chamber 1 is preferably in the range of $5 \times 10^{-3}$ to 1 Torr, since if the pressure is higher than 1 Torr, sputtering is hard to occur, while if lower than $5 \times 10^{-3}$ Torr, film formation by plasma CVD is decreased. Then, a RF voltage is applied to cathode 2 to cause glow discharge in vacuum reaction chamber 1, during which the gaseous raw material fed from gas feed pipe is subjected to glow discharge decomposition and deposited as a film on substrate 4 and at the same time, target 8 is sputtered by sputter ions such as of argon and the target material is also deposited on substrate 4. Various films can be formed by choice of various raw material gases and target materials in combination. In this case, magnetron sputtering is employed to apply a magnetic field over target 8. In the case of this magnetron sputtering, the plasma on target 8 is more strengthened to increase the sputtering rate as compared with the ordinary sputtering of planar type. That is, a strong plasma required for sputtering is present over the surface of the target and a weak plasma suitable for plasma CVD is present near the base plate. This state is as shown in FIG. 4 in which A is the weak plasma and B is the plasma strengthened by the magnetic field. For the purpose of forming this plasma distribution, a magnetic flux density of at least 50 gauss is required on the surface of a target.

In the prior art sputtering system, a good quality film cannot be given because there is also a strong plasma near a substrate similarly to on a target. In this embodiment, on the contrary, a target is in contact with a strong plasma suitable for sputtering and a substrate is in contact with a weak plasma suitable for plasma CVD, whereby a good quality film can be obtained. The plasma near the target is so strong that the sputtering rate on the target surface is sufficiently larger than the deposition rate by plasma CVD and the target material is always exposed to the plasma. The second embodiment can overcome the disadvantage of the first embodiment that the resultant amorphous silicon film covers the target, so addition of modifiers by sputtering is impossible.

Another feature of the second embodiment is that the film deposition rate and the cross-sectional composition of the deposited layer can widely be controlled by changing the strength of the magnetic field. That is, the strength of a plasma on the surface of a target can be controlled by the strength of a magnetic field and thus the quantity of a modifier in the cross-section of a film can be controlled. In an electromagnetic system, the strength of a magnetic field can be varied by controlling electric current, while in the case of using a permanent magnet, it can be controlled by the distance.

A further feature of the second embodiment is that a thin film can be produced at a high film deposition rate with holding high the conversion efficiency. In general, if the strength of a plasma is increased, the film deposition rate is raised, but the conversion efficiency of the film is lowered. According to this embodiment, on the contrary, the strength of a plasma is locally increased by the strength of a magnetic field to hold the film deposition rate and the film surface itself is prevented from deterioration due to the effect of plasma.

According to the process of the present invention, optical band gap of amorphous silicon can be varied by adding modifiers. As the modifier, there are preferably used Group IV elements capable of tetrahedral bonding, such for example as carbon, germanium, tin and lead. When using carbon as a modifier, the optical band gap is enlarged, and when using germanium, tin or lead as a modifier, it is reduced.

In addition, the present invention is applicable to addition of dopants. When using boron (B), aluminum (Al), phosphorus (P) and arsenic (As) as a target material and doping these dopants, for example, amorphous silicon can be subjected to valence electron control in p-type or n-type.

As illustrated in detail above, a thin film having various characteristics can readily be produced at a largely increased film growth rate according to the present invention.

The foregoing illustration is limited to the case of using monosilane (SiH$_4$) as a raw material gas for plasma CVD of amorphous silicon and argon as a sputtering gas, but of course, other gaseous silicon compounds such as silicon tetrafluoride (SiF$_4$) can be used as the raw material gas and other rare gases such as helium, neon, krypton and xenon can be used as the sputtering gas, with the similar effects.

Furthermore, in the case of forming an amorphous material containing hydrogen, hydrogen is further added to a sputtering gas or hydrogen itself is used as the sputtering gas. However, in the case of using monosilane (SiH$_4$), of course, hydrogenated amorphous silicon can be formed without further addition of hydrogen.

The following examples are given in order to illustrate the present invention in greater detail without limiting the same.

EXAMPLE 1

When using monosilane (SiH$_4$) as a raw material, argon(Ar) as a rare gas and crystalline silicon as a target, preparation conditions, film properties (dark conductivity $\sigma_d$; photoconductivity $\sigma_{ph}$; optical band gap $E_{go}$) and film growth rate are shown in Table 1. For comparison, the preparation conditions, film properties and film growth rate in the plasma CVD method of the prior art (having no target 8 in FIG. 2) are also shown in Table 2.

The preparation conditions are shown by the optimum conditions capable of giving the best film properties (large $\sigma_{ph}$ and small $\sigma_{ph}/\sigma_d$) in these methods.

TABLE 1

|  | Gas Flow Rate | | Reaction Pressure Torr | Substrate Temp. °C. | RF Power W | $\sigma_d$ ($\Omega$-cm)$^{-1}$ | $\sigma_{ph}$* ($\Omega$-cm)$^{-1}$ | $E_{go}$ eV | Film Growth Rate Å/Sec |
|---|---|---|---|---|---|---|---|---|---|
|  | SiH$_4$ SCCM | Ar SCCM |  |  |  |  |  |  |  |
| Example 1 | 10 | 90 | $5 \times 10^{-2}$ | 250 | 300 | $5 \times 10^{-9}$ | $2 \times 10^{-4}$ | 1.8 | 5 |
|  | 15 | 90 | $5 \times 10^{-2}$ | 250 | 300 | $5 \times 10^{-9}$ | $2 \times 10^{-4}$ | 1.8 | 5.5 |
|  | 10 | 90 | $5 \times 10^{-2}$ | 250 | 200 | $5 \times 10^{-9}$ | $2 \times 10^{-4}$ | 1.8 | 4.5 |
| Prior Art 1 | 10 | 90 | $3 \times 10^{-1}$ | 250 | 100 | $5 \times 10^{-9}$ | $1 \times 10^{-4}$ | 1.8 | 1.5 |

*photoconductivity in illumination of AM1.0

As is evident from Table 1, the film growth rate can be increased without deteriorating the film properties according to the present invention. During the same time, p-type or n-type amorphous silicon can be obtained by the use of silicon doped with an impurity such as boron or phosphorus as a target material.

EXAMPLE 2

When using SiH$_4$ as a raw material gas, Ar as a rare gas and tin (Sn) as a target, the preparation conditions of amorphous silicon doped with Sn, film properties and film growth rate are shown in Table 2. In the case of using an amorphous silicon film as a material of solar cell, it is important to reduce the optical band gap so as to improve the sensitivity to a light of long wavelength. For comparison, the preparation conditions, film properties and film growth rate in the plasma CVD method of the prior art are also shown in Table 2. In the prior art method, stannic chloride (SnCl$_4$) and tetramethyl tin (Sn(CH$_3$)$_4$) were used as a raw material of Sn, i.e. SnCl$_4$ and Sn(CH$_3$)$_4$ were fed by bubbling Ar therein. Other tin compounds such as dichlorodimethyl tin did not give good film properties.

In these methods, the preparation conditions are shown as to the optimum conditions capable of giving the best film preperties ($\sigma_{ph}$ is large and $E_{go}$ is less than 1.5 eV).

TABLE 2

|  | Gas Flow Rate | | Reaction Pressure Torr | Sn Raw Material | Substrate Temp. °C. | RF Power W | $\sigma_d$ ($\Omega$-cm)$^{-1}$ | $\sigma_{ph}$* ($\Omega$-cm)$^{-1}$ | $E_{go}$ eV | Film Growth Rate Å/sec |
|---|---|---|---|---|---|---|---|---|---|---|
|  | SiH$_4$ SCCM | Ar SCCM |  |  |  |  |  |  |  |  |
| Example 2 | 10 | 90 | $5 \times 10^{-2}$ | Sn Target | 250 | 300 | $3 \times 10^{-9}$ | $1 \times 10^{-4}$ | 1.45 | 2 |
|  | 15 | 90 | $5 \times 10^{-2}$ | Sn | 250 | 300 | $3 \times 10^{-9}$ | $1.5 \times 10^{-4}$ | 1.60 | 2.5 |

TABLE 2-continued

|  | Gas Flow Rate | | Reaction | | Substrate | RF | | | | Film |
|---|---|---|---|---|---|---|---|---|---|---|
|  | SiH$_4$ SCCM | Ar SCCM | Pressure Torr | Sn Raw Material | Temp. °C. | Power W | $\sigma d$ $(\Omega\text{-cm})^{-1}$ | $\sigma ph$ $(\Omega\text{-cm})^{-1}$ | $E_{go}$ eV | Growth Rate ÅA/sec |
|  | 10' | 90 | $5 \times 10^{-2}$ | Target Sn | 250 | 200 | $3 \times 10^{-4}$ | $1.5 \times ^{-4}$ | 1.60 | 2.5 |
| Prior Art 2 | 10 | 90 | $3 \times 10^{-1}$ | Target SnCl$_4$ | 250 | 100 | $2 \times 10^{-8}$ | $6 \times 10^{-7}$ | 1.43 | 1.8 |
| Prior Art 3 | 10 | 90 | $3 \times 10^{-1}$ | Sn(CH$_3$)$_4$ | 250 | 100 | $5 \times 10^{-9}$ | $4 \times 10^{-6}$ | 1.75 | 2.1 |

It is evident from Table 2 that in Example 2, the optical band gap $E_{go}$ was decreased from 1.8 eV in the case of adding no Sn to 1.45 eV, the photoconductivity was large and the dark conductivity was small. In Prior Art 2, on the contrary, $E_{go}$ was decreased, but the film properties were not good. This is possibly due to that chlorine enters into the film. In Prior Art 3, $E_{go}$ was scarcely changed and the film properties were not so good. This is possibly due to that Sn having an effect of decreasing $E_{go}$ and C having an effect of increasing $E_{go}$ enter into the film. The film growth rates were substantially similar both in the present invention and in the prior art.

EXAMPLE 3

When using SiH$_4$ as a raw material Gas, Ar as a sputtering gas and Sn as a target, the preparation conditions of amorphous silicon doped with Sn, film properties and film growth rate are shown in Table 3. In the case of using an amorphous silicon film as a material of solar cell, it is important to reduce the optical band gap so as to improve the sensitivity to a light of long wavelength. In Table 3 are also shown the results in the case of using no magnet. The preparation conditions are shown as to the optimum conditions capable of giving the best film properties ($\sigma_{ph}$ is large and $E_{go}$ is less than 1.5 eV) in each case.

TABLE 3

|  | Gas Flow Rate | | Reaction | Substrate | RF | | | | Film |
|---|---|---|---|---|---|---|---|---|---|
|  | SiH$_4$ SCCM | Ar SCCM | Pressure Torr | Temp. °C. | Power W | $\sigma d$ $(\Omega\text{-cm})^{-1}$ | $\sigma ph$ $(\Omega\text{-cm})^{-1}$ | $E_{go}$ eV | Growth Rate ÅA/sec |
| Example 3 | 10 | 90 | 0.08 | 250 | 50 | $3 \times 10^{-9}$ | $1 \times 10^{-1}$ | 1.45 | 5 |
| using | 15 | 90 | 0.08 | 250 | 50 | $3 \times 10^{-9}$ | $1.5 \times 10^{-1}$ | 1.6 | 6 |
| magnet | 10 | 90 | 0.08 | 250 | 40 | $3 \times 10^{-9}$ | $1.5 \times 10^{-1}$ | 1.6 | 6 |
| No magnet | 10 | 90 | 0.01 | 250 | 300 | $3 \times 10^{-9}$ | $1 \times 10^{-5}$ | 1.45 | 1 |

According to this Example using a magnet, there was obtained a good quality film with an optical band gap decreased from 1.8 eV in the case of adding no Sn to 1.45 eV, a large photoconductivity and a small dark conductivity. In the case of using no magnet, on the other hand, $E_{go}$ was decreased, but the film properties were not so good. This is possibly due to that the high frequency power is increased to 300 W so as to sputter Sn and the gas pressure is lowered to 0.01 Torr so as to allow the sputtered Sn atoms effectively to reach a substrate, resulting in strengthening of plasma near the base plate and formation of a number of defects or breakages in the film. The use of a magnet results in formation of a good quality film and increase of the film growth rate.

What is claimed is:

1. A process for the production of a multicomponent thin film, characterized by using jointly a sputtering method and a plasma CVD method at a pressure of not lower than a pressure capable of giving the maximum rate of film formation in the sputtering method.

2. The process of claim 1, wherein a magnetron sputtering method is used as the sputtering method.

3. The process of claim 1, wherein the thin film consists of an amorphous material containing at least silicon.

4. The process of claim 3, wherein the thin film consisting of the silicon-containing amorphous material is formed by the use of a silicon-containing compound gas and a rare gas.

5. The process of claim 3, wherein the thin film consisting of the silicon-containing amorphous material is formed by sputtering silicon.

6. The process of claim 5, wherein the silicon is doped.

7. The process of claim 3, wherein the thin film consisting of the silicon-containing amorphous material is formed by sputtering at least one dopant or modifier.

8. The process of claim 7, wherein the modifier is selected from the group consisting of carbon, germanium, tin and lead.

9. The process of claim 2, wherein the magnetron sputtering method is carried out with a magnetic flux density of at least 50 gauss on the surface of a target.

10. The process of claim 1, wherein a raw material gas containing at least one of monosilane and silicon tetrafluoride, diluted with at least one of hydrogen, helium and argon is used.

11. The process of claim 1, wherein at least one selected from the group consisting of carbon, silicon, germanium, tin and lead is used as a target material.

12. The process of claim 1, wherein the pressure is in the range of $5 \times 10^{-3}$ to 1 Torr.

13. The process of claim 2, wherein the magnetron sputtering method is carried out using an electromagnet.

14. The process of claim 2, wherein the magnetron sputtering method is carried out using a permanent magnet.

15. The process of claim 7, wherein the dopant is selected from the group consisting of boron, aluminum, phosphorus and arsenic.

* * * * *